United States Patent
Mancini et al.

(10) Patent No.: US 6,300,042 B1
(45) Date of Patent: Oct. 9, 2001

(54) LITHOGRAPHIC PRINTING METHOD USING A LOW SURFACE ENERGY LAYER

(75) Inventors: David P. Mancini, Fountain Hills; Douglas J. Resnick, Phoenix, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/198,627

(22) Filed: Nov. 24, 1998

(51) Int. Cl.[7] .................................................. G03F 7/00
(52) U.S. Cl. ............................ 430/325; 430/5; 430/311; 430/322; 430/330; 430/396
(58) Field of Search ........................ 430/5, 311, 322, 430/396, 325, 330

(56) References Cited

U.S. PATENT DOCUMENTS

| | | | |
|---|---|---|---|
| 3,508,982 | 4/1970 | Shearin | 156/3 |
| 3,561,963 | 2/1971 | Kiba | 96/36.2 |
| 3,940,506 | * 2/1976 | Heinecke | 427/38 |
| 4,004,044 | 1/1977 | Franco et al. | 427/43 |
| 4,022,928 | 5/1977 | Piwcyzk | 427/43 |
| 4,131,363 | 12/1978 | Shea et al. | 355/75 |
| 4,199,649 | * 4/1980 | Yundt | 428/411 |
| 4,282,314 | 8/1981 | Dinella et al. | 430/413 |
| 4,397,543 | 8/1983 | Kolbe et al. | 355/40 |
| 4,514,489 | 4/1985 | Garcia et al. | 430/327 |
| 4,528,261 | 7/1985 | Hauser | 430/322 |
| 4,735,890 | * 4/1988 | Nakane | 430/311 |
| 4,985,308 | 1/1991 | Squire | 428/422 |
| 5,061,024 | 10/1991 | Keys | 359/350 |
| 5,286,567 | * 2/1994 | Kubota | 428/422 |
| 5,356,739 | 10/1994 | Kawasaki et al. | 430/5 |
| 5,759,625 | 6/1998 | Laubacher et al. | 427/264 |
| 5,772,817 | * 6/1998 | Yen | 156/73.1 |

FOREIGN PATENT DOCUMENTS

| | | | |
|---|---|---|---|
| 2280924 | 8/1974 | (FR) | G03F/1/00 |
| 2249196 | 9/1991 | (GB) | G03F/1/14 |
| 5033813 | 3/1980 | (JP) | G03F/1/00 |
| 55-50627 | 4/1980 | (JP) | H01L/21/302 |
| 5122737 | 9/1980 | (JP) | G03F/1/00 |
| 56-32143 | 4/1981 | (JP) | G03F/1/00 |
| 56-81844 | 7/1981 | (JP) | G03F/1/00 |
| 6145471 | 9/1981 | (JP) | B29D/17/00 |
| 57-46243 | 3/1982 | (JP) | G03F/1/00 |
| 57-56929 | 5/1982 | (JP) | H01L/21/30 |
| 62-40458 | 2/1987 | (JP) | G03F/1/00 |
| 3164924 | 7/1988 | (JP) | C23C/16/30 |
| 00/01758 | * 1/2000 | (WO) . | |

OTHER PUBLICATIONS

"Surface Conversion for Antisticking to Reduce Patterning Defects in Photolithography", by Toshiharu Matsuzawa, Hiroshi Yanazawa and Norikazu Hasimoto, J. Electrochem. Soc.: Solid–State Science and Technology, Jan. 1981.

* cited by examiner

Primary Examiner—Mark F. Huff
Assistant Examiner—Nicole Barreca
(74) Attorney, Agent, or Firm—William E. Koch

(57) ABSTRACT

A method of contact printing on a device using a partially transparent mask (18) having first and second surfaces, comprises the steps of applying a layer of low surface energy polymeric material (22) to the first surface of the mask; placing the first surface (24) of the mask contiguous to the device (10), the layer of low surface energy polymeric material being substantially in contact with the device; and applying radiation (32) to the second surface of the mask for affecting a pattern in the device.

23 Claims, 3 Drawing Sheets

LITHOGRAPHIC PRINTING METHOD USING A LOW SURFACE ENERGY LAYER

BACKGROUND OF THE INVENTION

The present invention relates in general to contact printing and, more particularly, to a method of coating a mask in a photolithographic process.

The fabrication of integrated circuits involves the creation of several layers of materials that interact in some fashion. One or more of these layers may be patterned so various regions of the layer have different electrical characteristics, which may be interconnected within the layer or to other layers to create electrical components and circuits. These regions may be created by selectively introducing or removing various materials. The patterns that define such regions may be created by lithographic processes. For example, a layer of photoresist material is applied onto a layer overlying a wafer substrate. A mask (containing clear and opaque areas) is used to selectively expose this photoresist material by a form of radiation, such as ultraviolet light, electrons, or x-rays. Either the photoresist material exposed to the light, or that not exposed to the light, is removed by the application of a solvent. An etch may then be applied to the layer not protected by the remaining resist, and when the resist is removed, the layer overlying the substrate is patterned.

In this photolithographic process, the mask may be placed in contact with the photoresist (contact printing), may be placed close to the photoresist (proximity printing), or may be projected over a larger distance (projection printing). The contact printing method was probably the earliest method used to produce patterns on integrated circuits and may provide excellent resolution and high throughput. The mask must be correctly aligned on the photoresist/layer, e.g., when previous patterns have been created. The mask is secured to the photoresist covered layer by clamping or vacuum, for example.

However, for contact printing, defects in the pattern or the mask are routinely experienced, especially when the mask is used repeatedly to print several substrates consecutively without cleaning the mask. These defects print on the next layer that is exposed to the mask. Consequently, hard surface masks used in contact printing must be inspected and cleaned regularly, a time consuming and expensive process. And if the defects cannot be eliminated, the masks must be replaced.

These defects in contact printing occur when particles of the photoresist, being tacky or sticky in nature, stick to the mask. Conventional masks comprise a chrome and glass surface, with the radiation passing through the glass but not the chrome. Glass and chrome both have a high surface energy and readily induce particles of photoresist and dirt to cling thereto. When particles stick to the glass, the radiation is absorbed (blocked) and does not reach the photoresist on subsequent layers being processed. Failure of the radiation to reach these small areas on subsequent layers of photoresist creates defects. Furthermore, particles sticking to either the glass or the chrome prevent close contact (creating a gap) between the mask and the photoresist surface, reducing resolution of the resulting image. As resolution is reduced, the lines of demarcation between areas become less defined. Therefore, it is desired to have minimal diffraction induced resolution loss.

Efforts in the past to resolve these problems include applying a thin, one molecule deep, conversion coating (fluorinated hydrocarbon chlorosilane monomers) to the mask. This coating would bond to the glass portion of the mask, but has less affinity to bond with the chrome portion of the mask. Test results using a small number of samples showed that this coating had very limited durability. As a result of this lack of durability, the coating would have to be reapplied after only a few uses.

Therefore, an improved method of contact printing is desired that greatly reduces defects by reducing the number of particles attaching to the mask during the photolithography process.

DETAILED DESCRIPTION OF THE PREFERRED EMBODIMENT

Figure 1:
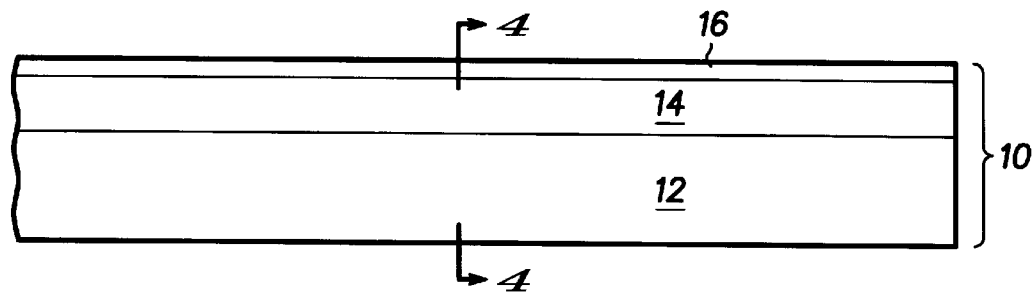
FIG. 1 illustrates a front view of layers of an integrated circuit prior to processing with a photolithographic mask.

Referring to FIG. 1, an integrated circuit 10 under manufacture is shown including a substrate 12 underneath a layer 14. The substrate 12 and layer 14 may comprise any material used in making integrated circuits, e.g., silicon or gallium arsenide as currently known. By conventional methods, a layer 16 of photoresist is applied to layer 14.

Figure 2:
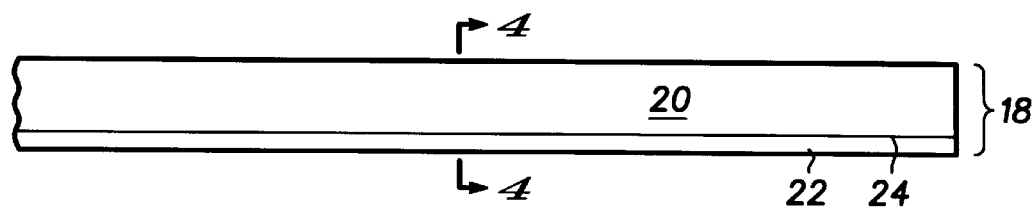
FIG. 2 illustrates a front view of a mask.

Referring to FIG. 2, a simple figure of a mask 18 is shown comprising a base 20 typically manufactured of glass or quartz, with sections of opaque material, typically chrome, interspersed throughout in a manner well known to those skilled in the art. A layer 22 of low surface energy polymeric material containing solvents is applied to the surface 24 of the base 20. The material, in one embodiment, comprises an amorphous tetrafluoroethylene containing resin, or a copolymer of tetrafluoroethylene and bistrifluoromethyl difluoro dioxole. These materials are temperature resistant, durable, transparent, and have substantially a zero moisture absorption and a low coefficient of friction. More importantly, they are resistant to adhesion which prevents the material from collecting particles of resist and dirt when making contact with the resist. In other embodiments, the material may comprise an amorphous fluoropolymer, hydrocarbon or a silicone based material, for example. The material may be applied in any one of several conventional ways, such as spin coating, spraying, dipping, or vapor deposition. The material may be applied with a thickness, for example, of 40 Å to 50 microns, but 700 Å has been shown to work very well.

Figure 3:
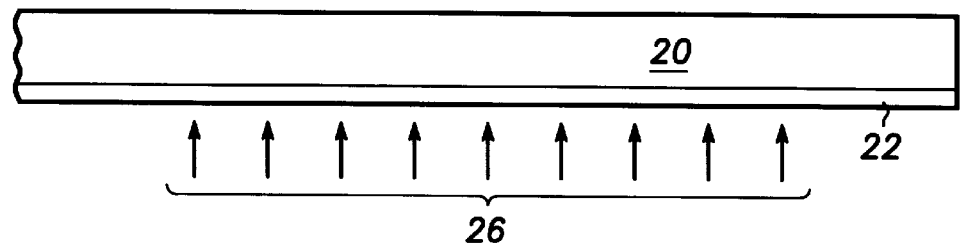
FIG. 3 illustrates a front view of a mask being subjected to heat.

In FIG. 3, heat 26 (represented by the arrows) is applied to the layer 22 of low surface energy polymeric material to remove the solvents. Even though the material is thermally stable with a high $T_g$, heating (baking) the material above $T_g$ (approximately 160° C. to 300° C.) for a short duration, e.g. baking for 3 minutes at 180° C., will remove solvents within the material.

Figure 4:
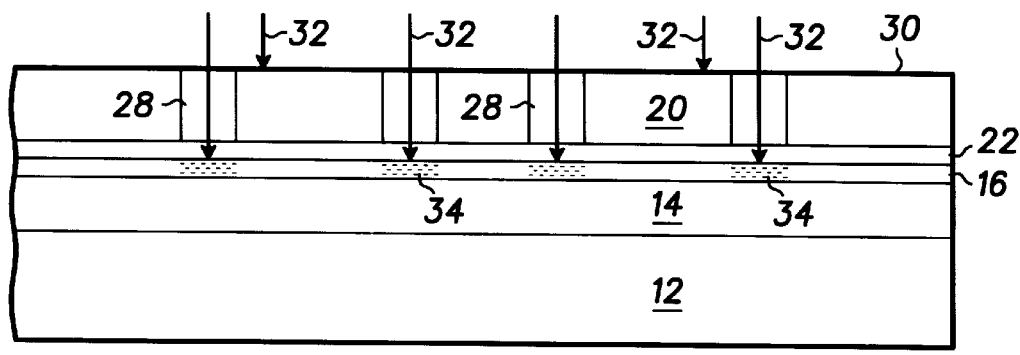
FIG. 4 illustrates a cut away view taken along the line 4—4 of FIG. 1 during processing with the mask in contact with the integrated circuit.

Referring to FIG. 4, a cutaway view is shown of the mask 18 in contact with the integrated circuit 10. As mentioned above, transparent material 28 is interspersed within the base 20. Radiation 32 (represented by the arrows) is applied to the surface 30 of the base 20, being absorbed and reflected by the base 20, but passing through transparent material 28 and low surface energy polymeric material of layer 22 to strike the resist of layer 16 creating a pattern defined by portions 34 of layers 16.

Then the mask 18 is removed without substantially any of the resist of layer 16 sticking to the material on layer 22. Dry adhesion between the mask 18 and layer 16 and between layer 16 to the underlying layer 14, may be expressed by the dispersion interaction as follows:

$$W_{a(MR)}=2(\gamma M^d \gamma R^d)$$

$$W_{a(RS)}=2(\gamma R^d \gamma S^d)$$

where the suffixes M, R, and S denote the mask 18, layer 16, and layer 14, respectively. $W_a$ is the work of adhesion indicating the affinity between two materials denoted by suffixes, and $\gamma^d$ is the dispersion component of surface free energy. Since adhesion increases with $W_a$, the photoresist will stick to the photomask rather than the substrate when $$W_{a(MR)}>W_{a(RS)}$$

Substituting the first and second formulas into the third produces $$\gamma M^d > \gamma S^d$$

Consequently, to prevent the photoresist sticking to the mask, $\gamma M^d$ must be smaller than $\gamma S^d$. Lowering the surface energy of the mask by coating its surface with the appropriate low surface energy material accomplishes this goal. By the resist of layer 16 not sticking to the material 22, at least two advantages over the prior art are gained. First, the mask 18 (material 22) can be placed in direct contact (no gap) with the photoresist of layer 16 on subsequent masking operations thereby providing better resolution. Second, the radiation 32,36 passing through the glass 28 will not be "blocked" from reaching the subsequent resist by particles of resist from the previous operation, thereby preventing defects. One test of a low surface energy material demonstrated no change in exposure energy, no introduction of defects and no loss of resolution after 100 wafer exposures.

Figure 5:
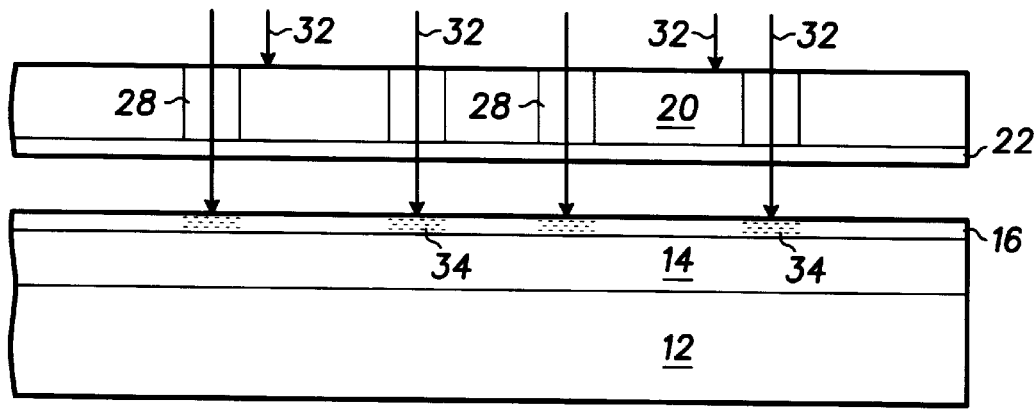
FIG. 5 illustrates a cut away view taken along the line 4—4 of FIG. 1 during processing with the mask separated from the integrated circuit.

FIG. 5 illustrates another embodiment wherein the mask 18 is separated from the layer 16 of resist prior to the radiation 32,36 being applied. This method is typically referred to as proximity printing. The mask 18 is placed in contact with layer 16 for proper allignment.

Figure 6:
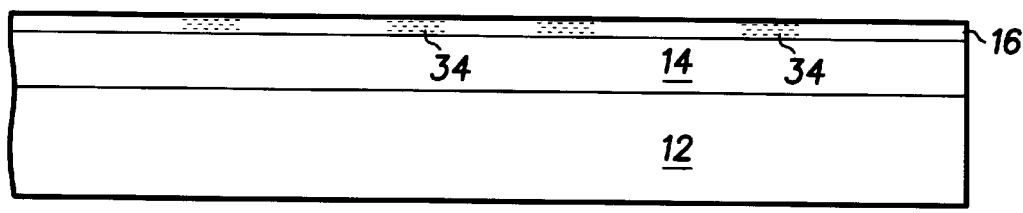
FIGS. 6–11 illustrate semiconductor processing of the integrated circuit of FIG. 1 after processing with the mask.
Figure 7:
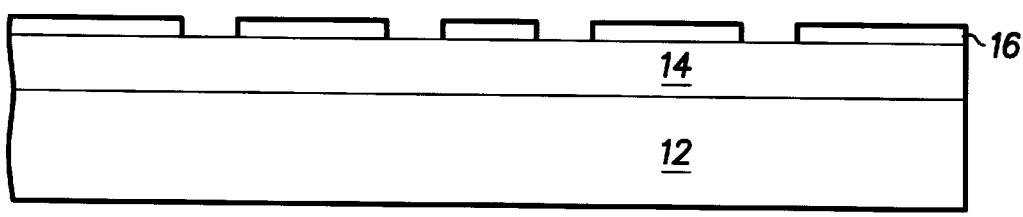

FIGS. 6 and 7 illustrate typical processes after the mask 18 is removed. The portions 34 of the photoresist of layer 16 irradiated (exposed) are made soluble in a solvent (developer), the soluble portion of the photoresist of layer 16 being removed. It should be understood that, in another embodiment, the radiation may make the photoresist of layer 16 insoluble, depending on the solvent selected, with the non-radiated portion being removed (not shown here).

Figure 8:
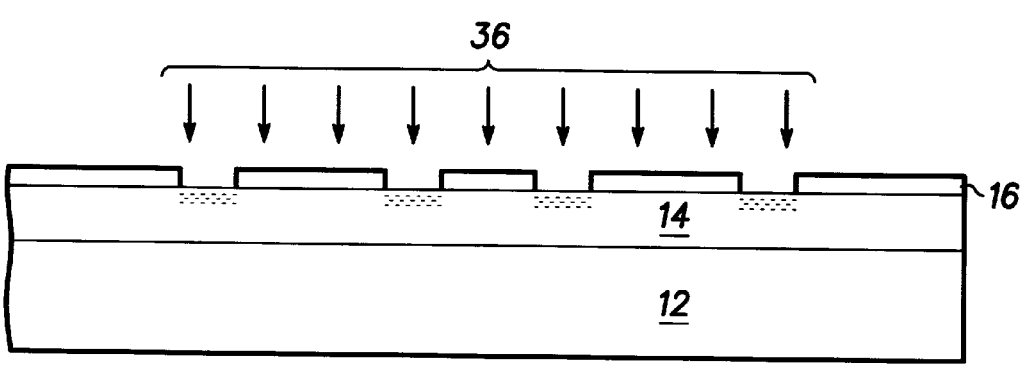
Figure 9:
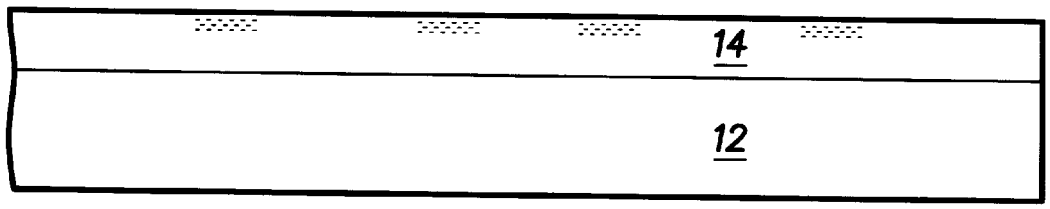
Figure 10:
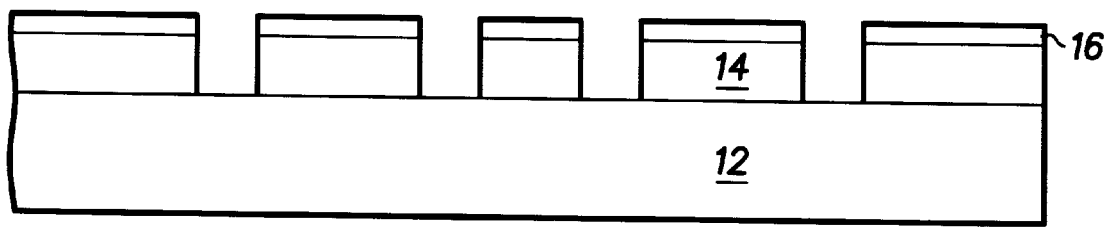
Figure 11:
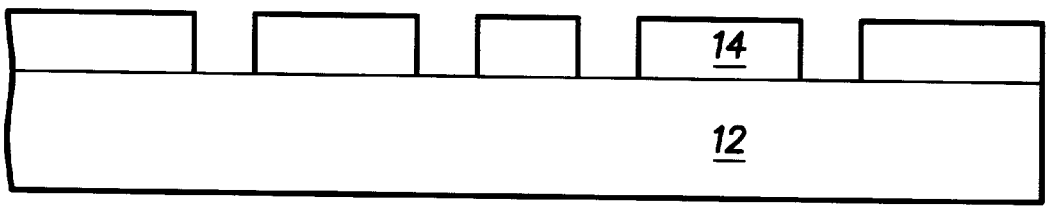

Then, using conventional methods, the integrated circuit 10 is further processed. For example, FIGS. 8 and 9 show radiation 36 such as ions being implanted into layer 14 prior to the layer 16 being removed. Alternatively, for example, FIGS. 10 and 11 show layer 14 being etched prior to the removal of the layer 16. This invention may be applied to contact printing or stamping lithography in many other technologies besides the semiconductor industry, e.g., the making of compact discs (CDs) or other such device. CDs are manufactured with a lithographic process by replicating data as a series of bumps on a plastic disc that can be read with the use of a laser beam. In a manner well known to those in the CD industry, a nickel pattern is formed by electroplating nickel onto a photoresist patterned glass master. A stamper is then formed by separating the nickel from the glass and removing the photoresist. The pattern information on the stamp is transferred into a soft and malleable injection molded polycarbonate via a stamping process. This process typically contaminates the stamp when excess polycarbonates and light dirt or soil adhere to the nickel master, causing similar problems as discussed above for the semiconductor example. A low surface energy release agent coating can be applied to the nickel master to prevent contamination.

Yet another embodiment comprises placing the mask 18 a predetermined distance from the device (as represented in FIG. 5) on which a pattern is to be created by projecting radiation typically through a lens. This method is typically referred to as projection printing. The layer 22 of low surface energy polymeric material prevents dirt from the environment from sticking to the mask 18.

In summary, a photolithography mask with a coating material of low surface energy polymeric material is provided that has a low surface energy, and is (1) easily applied, (2) easily removed (e.g., with a fluorinated solvent), (3) is transparent to exposure radiation, (4) is thin and uniformly applied to avoid resolution losses, and (5) is cohesively strong for durability.

What is claimed is:

1. A method of contact printing on a device using a mask that is partially transparent having first and second surfaces, comprising the steps of:

(a) applying a layer of low surface energy amorphous fluoropolymer material to the first surface of the mask;

(b) placing the first surface of the mask contiguous to the device, the layer of low surface energy amorphous fluoropolymer material being in contact with the device; and (c) applying radiation to the second surface of the mask for affecting a pattern in the device.

2. The method of claim 1 wherein step (a) comprises the step of applying amorphous tetrafluoroethylene containing resin to the first surface of the mask.

3. The method of claim 1 wherein step (a) comprises the step of applying the amorphous fluoropolymer material with a thickness of 700 Å to the first surface of the mask.

4. The method of claim 1 wherein step (a) comprises the step of applying amorphous fluoropolymer with a thickness within the range of 40 Å to 50 microns to the first surface of the mask.

5. The method of claim 1 wherein step (a) comprises the step of applying a copolymer of tetrafluoroethylene and bistrifluoromethyl difluoro dioxole to the surface of the mask.

6. The method of claim 1, subsequent to step (a), further comprising the step of (d) heating the low surface energy amorphous fluoropolymer material.

7. The method of claim 1, subsequent to step (b), further comprising the step of (e) separating the mask and the device.

8. A method of creating patterns in a material having a surface, comprising the steps of:

(a) applying a layer of low surface energy amorphous fluoropolymer material to the surface of a mask;

(b) applying resist to the surface of the material;

(c) placing the surface of the mask in contact with the resist;

(d) applying radiation to the mask so a pattern is created in the resist;

(e) removing a portion of the resist; and (f) modifying the surface of the material where the resist was removed.

9. The method of claim 8 wherein step (a) comprises the step of applying amorphous tetrafluoroethylene containing resin to the first surface of the mask.

10. The method of claim 8 wherein step (a) comprises the step of applying the amorphous fluoropolymer with a thickness of 700 Å to the surface of the mask.

11. The method of claim 8 wherein step (a) comprises the step of applying amorphous fluoropolymer with a thickness within the range of 40 Å to 50 microns to the first surface of the mask.

12. The method of claim 8 wherein step (a) comprises the step of applying a copoylmer of tetrafluoroethylene and bistrifluoromethyl difluoro dioxole to the first surface of the mask.

13. The method of claim 8, subsequent to step (a), further comprising the step of (g) heating the low surface energy amorphous fluoropolymer material.

14. The method of claim 8, subsequent to step (c), further comprising the step of separating the mask and the resist.

15. A method of manufacturing an integrated circuit device, comprising the steps of:

(a) forming a semiconductor layer having a surface;

(b) applying a low surface energy amorphous fluoropolymer material to a surface of a mask;

(c) applying resist to the surface of the semiconductor layer;

(d) placing the low surface energy amorphous fluoropolymer material in contact with the resist;

(e) applying radiation to the mask for creating a pattern in the resist;

(f) removing a portion of the resist; and (g) modifying the surface of the semiconductor layer where the resist was removed.

16. The method of claim 15 wherein step (b) comprises the step of applying amorphous tetrafluoroethylene containing resin to the first surface of the mask.

17. The method of claim 15 wherein step (b) comprises the step of applying the amorphous fluoropolymer with a thickness of 700 Å to the surface of the mask.

18. The method of claim 15 wherein step (b) comprises the step of applying amorphous fluoropolymer with a thickness within the range of 40 Å to 50 microns to the first surface of the mask.

19. The method of claim 15 wherein step (b) comprises the step of applying a copoylmer of tetrafluoroethylene and bistrifluoromethyl difluoro dioxole to the first surface of the mask.

20. The method of claim 15, subsequent to step (b), further comprising the step of (h) heating the low surface energy amorphous fluoropolymer material.

21. The method of claim 15, subsequent to step (d), further comprising the step of separating the mask and the resist.

22. A method of printing on a device using a mask that is partially transparent having first and second surfaces, comprising the steps of:

(a) applying a layer of low surface energy amorphous fluoropolymer material to the first surface of the mask;

(b) placing the first surface of the mask at a predetermined distance from the device; and (c) applying radiation to the second surface of the mask for affecting a pattern in the device.

23. The method of claim 22, subsequent to step (a), further comprising the step of (d) heating the low surface energy amorphous fluoropolymer material.

\* \* \* \* \*